(12) United States Patent
Umeda

(10) Patent No.: US 8,083,309 B2
(45) Date of Patent: Dec. 27, 2011

(54) LIQUID EJECTING APPARATUS AND LIQUID EJECTING METHOD

(75) Inventor: Atsushi Umeda, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 475 days.

(21) Appl. No.: 12/145,725

(22) Filed: Jun. 25, 2008

(65) Prior Publication Data

US 2009/0002036 A1   Jan. 1, 2009

(30) Foreign Application Priority Data

Jun. 26, 2007   (JP) ................. 2007-167802

(51) Int. Cl.
 *B41J 29/38*   (2006.01)
(52) U.S. Cl. ................. 347/11; 347/10; 347/5
(58) Field of Classification Search .......... 347/5, 9, 347/10, 11, 12
See application file for complete search history.

(56) References Cited

U.S. PATENT DOCUMENTS

| | | | | |
|---|---|---|---|---|
| 6,364,444 | B1 * | 4/2002 | Ota ................... | 347/10 |
| 6,382,754 | B1 * | 5/2002 | Morikoshi et al. ...... | 347/11 |
| 7,744,182 | B2 * | 6/2010 | Nakayama ............. | 347/10 |

FOREIGN PATENT DOCUMENTS

| | | |
|---|---|---|
| JP | 08-300646 | 11/1996 |
| JP | 11-170529 | 6/1999 |
| JP | 2000-103055 | 4/2000 |
| JP | 2000-238264 | 9/2000 |
| JP | 2001-150666 | 6/2001 |
| JP | 2004-306434 | 11/2004 |
| JP | 2005-169737 | 6/2005 |
| JP | 2005-254644 | 9/2005 |

* cited by examiner

*Primary Examiner* — Lam S Nguyen

(74) *Attorney, Agent, or Firm* — Maschoff Gilmore & Israelsen

(57) ABSTRACT

A liquid ejection apparatus includes an element that is charged and discharged so as to perform an operation to eject a liquid, an analog signal generating unit that generates an analog signal having a voltage change pattern for determining the operation of the element, a charging transistor that amplifies a current of the analog signal while the element is charged, and pushes the amplified current toward the element, the charging transistor having a current source terminal, to which a current source is connected, and a push terminal for pushing the current, and a current source connector that selects at least one current source from among a plurality of current sources according to a voltage of the analog signal, and connects the selected current source to the current source terminal.

13 Claims, 7 Drawing Sheets

LIQUID EJECTING APPARATUS AND LIQUID EJECTING METHOD

BACKGROUND

1. Technical Field

The present invention relates to a liquid ejecting apparatus and a liquid ejecting method.

2. Related Art

Known liquid ejecting apparatuses include an element which is charged and discharged so as to perform an operation to eject a liquid, and a transistor which pushes a current to the element or pulls a current from the element. Such liquid ejecting apparatuses generate a driving signal by amplifying the current of an analog signal input to a bipolar transistor and apply the driving signal to the element. One such liquid ejecting apparatus is provided with two pairs of transistors, to which different power supply voltages are applied, in order to suppress power consumption in the transistor (for example, see JP-A-11-170529).

In such a liquid ejecting apparatus, the pairs of transistors are switched according to the voltage of the analog signal. Accordingly, power saving can be achieved, compared with a case in which a pair of transistors are provided. However, there is a need for improvement in that the sets of transistors amplify the current.

SUMMARY

An advantage of some aspects of the invention is that it is possible to achieve power saving.

According to an aspect of the invention, a liquid ejection apparatus includes an element that is charged and discharged so as to perform an operation to eject a liquid, an analog signal generating unit that generates an analog signal having a voltage change pattern for determining the operation of the element, a charging transistor that amplifies a current of the analog signal while the element is charged, and pushes the amplified current toward the element, the charging transistor having a current source terminal, to which a current source is connected, and a push terminal for pushing the current, and a current source connector that selects at least one of a plurality of current sources according to a voltage of the analog signal, and connects the selected current source to the current source terminal.

Features and advantages of the invention other than the above will become clear by reading the specification with reference to the accompanying drawings.

BRIEF DESCRIPTION OF THE DRAWINGS

The invention will be described with reference to the accompanying drawings, wherein like members reference like elements.

DESCRIPTION OF EXEMPLARY EMBODIMENTS

Figure 1:
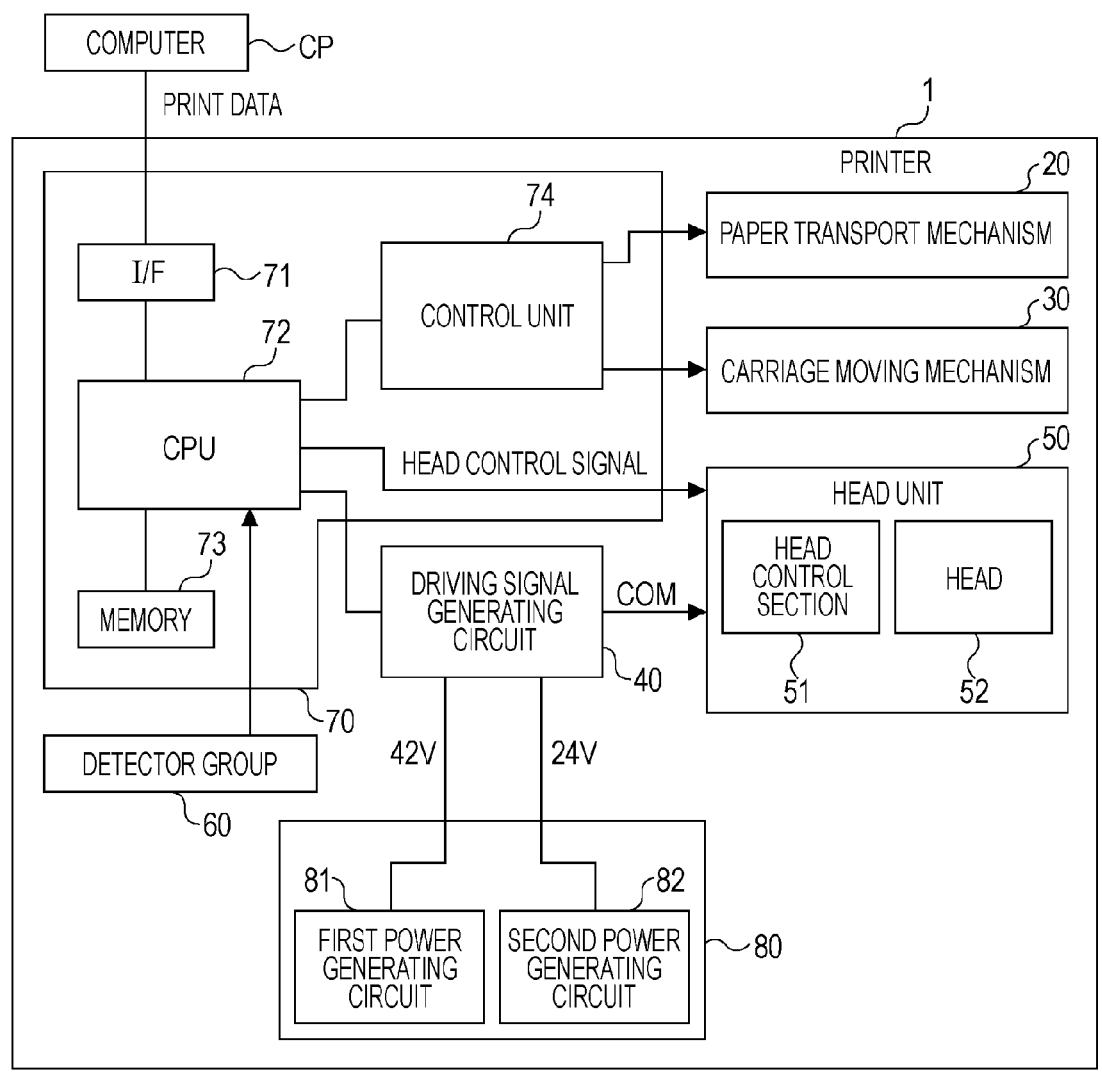
FIG. 1 is a block diagram illustrating the configuration of a printing system.

At least the following will be apparent according to the specification and the accompanying drawings.

According to a first aspect of the invention, a liquid ejecting apparatus includes an element that is charged and discharged so as to perform an operation to eject a liquid, an analog signal generating unit that generates an analog signal having a voltage change pattern for determining the operation of the element, a charging transistor that amplifies a current of the analog while the element is charged, and pushes the amplified current toward the element, the charging transistor having a current source terminal, to which a current source is connected, and a push terminal for pushing the current, and a current source connector that selects at least one current source from among a plurality of current sources according to a voltage of the analog signal, and connects the selected current source to the current source terminal.

With this liquid ejecting apparatus, a current source suitable for the voltage of the analog signal can be used, thereby achieving power saving.

In the liquid ejecting apparatus according to the aspect of the invention, the current source connector may select at least one current source from among the plurality of current sources at different voltages. In this case, the current source connector may switch a current source to be selected while the element is charged.

With this liquid ejecting apparatus, a current source suitable for the voltage of the analog signal can be used, thereby suppressing power consumption of the charging transistor.

In the liquid ejecting apparatus according to the first aspect of the invention, the plurality of current sources may have a first current source at a first voltage and a second current source at a second voltage lower than the first voltage. The current source connector may include a current source switch that is provided between the first current source and the current source terminal, and a control circuit that outputs, to the current source switch, a control signal at a voltage level determined to control the operation of the current source switch on the basis of the voltage of the analog signal.

With this liquid ejecting apparatus, the control circuit can determine a switching timing of the current source depending on setting, thereby preventing the analog signal from being distorted after being amplified.

In the liquid ejecting apparatus according to the first aspect of the invention, the plurality of current sources may have a first current source at a first voltage and a second current source at a second voltage lower than the first voltage. The current source connector may include a current source switch that is provided between the first current source and the current source terminal, and an element that is provided between the second current source and the current source terminal, and allows charge movement from the second current source to the current source terminal while blocking charge movement from the current source terminal to the second current source.

With this liquid ejecting apparatus, by controlling the current source switch, switching from the second current source to the first current source or switching from the first current source to the second current source can be performed. Therefore, the configuration or control can be simplified.

In the liquid ejecting apparatus according to the first aspect of the invention, the current source switch may have a transistor.

With this liquid ejecting apparatus, connection or disconnection of the first current source can be controlled with simple configuration.

In the liquid ejecting apparatus according to the first aspect of the invention, the first current source may have a power supply circuit, and the second current source may have a capacitor.

With this liquid ejecting apparatus, even if a charge accumulated in the capacitor of the second current source is consumed and charge supply becomes difficult, a charge can be supplied from the power supply circuit in the first current source. Therefore, the reliability of the apparatus can be improved.

In the liquid ejecting apparatus according to the first aspect of the invention, the capacitor may be charged with a charge to be moved while the element is discharged. The liquid ejecting apparatus may further include a discharging transistor that amplifies the current of the analog signal while the element is discharged, and pulls the current from the element, the discharging transistor having a pull terminal for pulling the current and an emission terminal for emitting the charge, and a charge emission destination connector that selects at least one charge emission destination from among a plurality of charge emission destinations including the capacitor according to the voltage of the analog signal, and connects the selected charge emission destination to the emission terminal. The second current source may emit the charge accumulated in the capacitor while the element is charged.

With this liquid ejecting apparatus, power saving can be achieved.

It will also be apparent that the following liquid ejecting apparatus can be implemented.

According to a second aspect of the invention, a liquid ejecting apparatus includes an element that is charged and discharged so as to perform an operation to eject a liquid, an analog signal generating unit that generates an analog signal having a voltage change pattern for determining the operation of the element, a discharging transistor that amplifies the current of the analog signal while the element is discharged, and pulls the current from the element, the discharging transistor having a pull terminal for pulling the current and an emission terminal for emitting the charge, and a charge emission destination connector that selects at least one charge emission destination from among a plurality of charge emission destinations according to the voltage of the analog signal, and connects the selected charge emission destination to the emission terminal.

With this liquid ejecting apparatus, a charge emission destination suitable for the voltage of the analog signal can be used, thereby achieving power saving.

In the liquid ejecting apparatus according to the second aspect of the invention, the charge emission destination connector may select at least one charge emission destination from among a plurality of charge emission destinations at different voltages. In this case, the charge emission destination connector may switch a charge emission destination to be selected while the element is discharged.

With this liquid ejecting apparatus, the charge can be emitted to a charge emission destination suitable for the voltage of the analog signal, thereby suppressing power consumption of the discharging transistor.

In the liquid ejecting apparatus according to the second aspect of the invention, the plurality of charge emission destinations may have a first charge emission destination at a first voltage, and a second charge emission destination at a second voltage higher than the first voltage. The charge emission destination connector may have a charge emission destination switch that is provided between the emission terminal and the first charge emission destination, and a control circuit that outputs, to the charge emission destination switch, a control signal at a voltage level determined to control the operation of the charge emission destination switch on the basis of the voltage of the analog signal.

With this liquid ejecting apparatus, the control circuit can determine a switching timing of the charge emission destination depending on setting, thereby preventing the analog signal from being distorted after being amplified.

In the liquid ejecting apparatus according to the second aspect of the invention, the plurality of charge emission destinations may have a first charge emission destination at a first voltage, and a second charge emission destination at a second voltage higher than the first voltage. The charge emission destination connector may include a charge emission destination switch that is provided between the emission terminal and the first charge emission destination, and an element that is provided between the emission terminal and the second charge emission destination, and allows charge movement from the emission terminal to the second charge emission destination, while blocking charge movement from the second charge emission destination to the emission terminal.

With this liquid ejecting apparatus, by controlling the charge emission destination switch, switching from the second charge emission destination to the first charge emission destination or switching from the first charge emission destination to the second charge emission destination can be performed. Therefore, the configuration or control can be simplified.

In the liquid ejecting apparatus according to the second aspect of the invention, the charge emission destination switch may be a transistor.

With this liquid ejecting apparatus, connection or disconnection of the first charge emission destination can be controlled with simple configuration.

In the liquid ejecting apparatus according to the second aspect of the invention, the first charge emission destination may be a ground, and the second charge emission destination may be a capacitor.

It will also be apparent that the following liquid ejecting method can be implemented.

According to a third aspect of the invention, a liquid ejecting method includes generating an analog signal having a voltage change pattern for determining an operation of an element, which is charged and discharged so as to perform an operation to eject a liquid, while the element is charged, selecting at least one current source from among a plurality of current sources according to a voltage of the analog signal, and amplifying a current of the analog signal by the selected current source and pushing the amplified current toward the element.

It will also be apparent that the following liquid ejecting method can be implemented.

According to a fourth aspect of the invention, a liquid ejecting method includes generating an analog signal having a voltage change pattern for determining an operation of an element, which is charged and discharged so as to perform an operation to eject a liquid, while the element is discharged, selecting at least one charge emission destination from among a plurality of charge emission destinations according to a voltage of the analog signal, and amplifying a current of the analog signal, pulling a current from the element, and emitting a charge to the selected charge emission destination.

FIRST EMBODIMENT

Regarding Printing System

FIG. 1 is a block diagram illustrating the configuration of a printing system. A printing system shown in FIG. 1 has a printer 1 and a computer CP. The printer 1 corresponds to a liquid ejecting apparatus, and ejects ink (a kind of liquid) onto a medium, such as paper, cloth, or film. It should be noted that the medium corresponds to a target on which the liquid is to be ejected. The computer CP is communicably connected to the printer 1. In order to print an image with the printer 1, the computer CP transmits print data corresponding to the image to the printer 1. The print data includes dot forming data. The dot forming data is data regarding a dot to be formed on the paper (data regarding color and size of the dot). The dot forming data is, for example, two-bit data.

Outline of Printer 1

The printer 1 has a paper transport mechanism 20, a carriage moving mechanism 30, a driving signal generating circuit 40, a head unit 50, a detector group 60, a printer-side controller 70, and a power supply 80.

The paper transport mechanism 20 transports a paper serving as a medium in a transport direction. The carriage moving mechanism 30 moves the head unit 50 in a predetermined direction (for example, a paper widthwise direction). A head 52 in the head unit 50 ejects ink (a kind of liquid) onto the paper. The driving signal generating circuit 40 generates a driving signal COM. The driving signal COM is used during printing on the paper. For example, as shown in a part of FIG. 3, the driving signal COM is a series of signals including a driving pulse. Here, the driving pulse is a voltage change pattern that causes a piezoelectric element 52a (see FIG. 2) in the head 52 to perform a predetermined operation.

Figure 2:
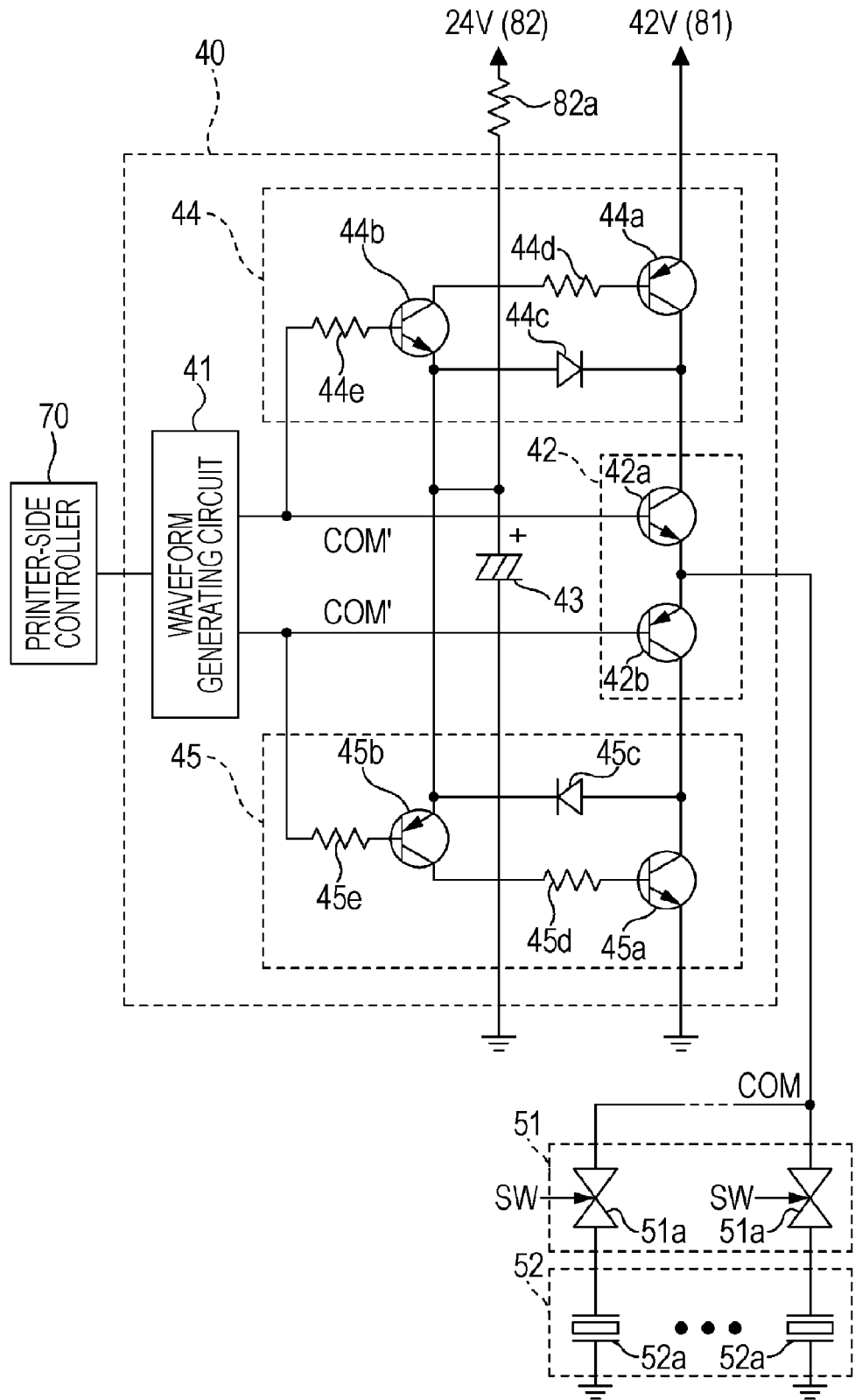
FIG. 2 is a diagram illustrating a driving signal generating circuit and a peripheral portion according to a first embodiment of the invention.

The head unit 50 has a head control section 51 and a head 52. As shown in FIG. 2, the head 52 has a piezoelectric element 52a. The piezoelectric element 52a corresponds to an element that performs an operation to eject the liquid. A plurality of piezoelectric elements 52a are provided to correspond to nozzles (not shown) in the head 52. For example, 96 to 180 piezoelectric elements 52a are provided for each color. Each of the piezoelectric elements 52a is a kind of a capacitive element capable holding a charge, and is charged or discharged by applying a required segment of the driving signal COM. Then, the piezoelectric element 52a is deformed according to charging/discharging, such that ink stored in a pressure chamber (not shown) of the head 52 undergoes a change in pressure. Due to the change in pressure, ink is ejected from the nozzles. Accordingly, the deformation of the piezoelectric element 52a corresponds to the operation to eject ink. This operation is determined by the voltage change pattern of the driving signal COM.

The head control section 51 selectively applies, to the piezoelectric elements 52a, the required segment of the driving signal COM generated by the driving signal generating circuit 40. To this end, the head control section 51 has a plurality of switches 51a that are provided to correspond to the piezoelectric elements 52a in a supply line of the driving signal COM. Then, the head control section 51 controls the switches 51a to apply the required segment of the driving signal COM to the piezoelectric elements 52a. At this time, a desired amount of ink can be ejected from the nozzles if the required segment is appropriately selected.

The detector group 60 has a plurality of detectors for monitoring the states of the printer 1. The detection results by the detectors are output to the printer-side controller 70. The printer-side controller 70 controls the individual units on the basis of the print data from the computer CP and the detection results from the detectors to print an image on the paper.

The power supply 80 generates power to be supplied to a current amplifying transistor in the driving signal generating circuit 40. The power supply 80 has a first power generating circuit 81 which generates a first power supply voltage (42 V), and a second power generating circuit 82 which generates a second power supply voltage (24 V). The first power generating circuit 81 corresponds to a power supply circuit.

Essential Parts of Printer 1

Regarding Printer-Side Controller 70

The printer-side controller 70 performs the overall control of the printer 1. For example, the printer-side controller 70 controls the paper transport mechanism 20, the carriage moving mechanism 30, the driving signal generating circuit 40, and the head unit 50. As shown in FIG. 1, the printer-side controller 70 has an interface section 71, a CPU (Central Processing Unit) 72, a memory 73, and a control unit 74. The interface section 71 exchanges data with the computer CP. The CPU 72 performs the overall control of the printer 1. The memory 73 reserves an area for storing computer programs and a working area. The CPU 72 controls the individual units according to the computer programs stored in the memory 73. For example, the CPU 72 controls the paper transport mechanism 20 or the carriage moving mechanism 30 by means of the control unit 74. In addition, the CPU 72 transmits a head control signal for controlling the operation of the head 52 to the head control section 51 or transmits a control signal for generating the driving signal COM to the driving signal generating circuit 40.

Here, the control signal for generating the driving signal COM is also referred to as DAC data which is, for example, multi-bit digital data. The DAC data is data for determining the voltage change pattern of the driving signal COM generated by the driving signal generating circuit 40. That is, the DAC data determines a voltage of a voltage waveform signal COM' which is generated by a waveform generating circuit 41 (see FIG. 2) in the driving signal generating circuit 40. The DAC data may be said to indirectly indicate the voltage of the driving signal COM, and thus it corresponds to voltage waveform information. The DAC data is stored in a predetermined area of the memory 73. Then, the DAC data is read out by the CPU 72 when the driving signal COM is generated.

Regarding Driving Signal Generating Circuit 40

The driving signal generating circuit 40 corresponds to a driving signal generating device which generates the driving signal COM. Accordingly, the printer 1 may be said to be a liquid ejecting apparatus having incorporated therein a driving signal generating device. As shown in FIG. 2, the driving signal generating circuit 40 has a waveform generating circuit 41, a current amplifying circuit 42, a capacitor 43, a first selection circuit 44, and a second selection circuit 45.

Regarding Waveform Generating Circuit 41

The waveform generating circuit 41 generates a voltage waveform signal COM' having a voltage change pattern determined by the DAC data. That is, the waveform generating circuit 41 has a digital-to-analog converter that converts the DAC data as digital data into the voltage waveform signal COM' as an analog signal. The voltage waveform signal COM' is a signal having a basic voltage waveform of the driving signal COM. That is, the voltage waveform signal COM' may be said to be a signal for determining the voltage change pattern of the driving signal COM. Here, the piezoelectric element 52a operates according to the voltage change pattern of an applied segment of the driving signal COM. Accordingly, the voltage waveform signal COM' corresponds to an analog signal having a voltage change pattern for determining the operation of the piezoelectric element 52a. In addition, the waveform generating circuit 41 corresponds to an analog signal generator which generates an analog signal. Moreover, the waveform generating circuit 41 is provided with output terminals of the voltage waveform signal COM' for two channels. This is because two transistors in the current amplifying circuit 42 use the voltage waveform signal COM'.

Regarding Current Amplifying Circuit 42

The current amplifying circuit 42 corresponds to a current amplifier. The current amplifying circuit 42 amplifies a current of the voltage waveform signal COM' as an analog signal, and outputs the amplified signal as the driving signal COM. The current amplifying circuit 42 has an NPN transistor 42a and a PNP transistor 42b, which are connected with each other in a complementary manner, as current amplifying transistors.

The NPN transistor 42a is a charging transistor which operates while the piezoelectric element 52a is charged. A collector of the NPN transistor 42a is connected to the first power generating circuit 81 or the capacitor 43 through the first selection circuit 44. An emitter of the NPN transistor 42a is connected to a supply line of the driving signal COM, and a base of the NPN transistor 42a is connected to a supply line of the voltage waveform signal COM'. The NPN transistor 42a is turned on when the voltage of the voltage waveform signal COM' increases, and amplifies a current of the voltage waveform signal COM' and pushes the amplified current to the piezoelectric element 52a. During the current amplification, the first power generating circuit 81 or the capacitor 43 functions as a current source. Accordingly, the collector of the NPN transistor 42a corresponds to a current source terminal to which a current source is connected. In addition, the amplified current is pushed from the emitter of the NPN transistor 42a. Accordingly, the emitter corresponds to a push terminal for pushing a current. Furthermore, the voltage waveform signal COM' (analog signal) is input to the base of the NPN transistor 42a. That is, the base of the NPN transistor 42a corresponds to an analog signal input terminal to which an analog signal is input.

The PNP transistor 42b is a discharging transistor which operates when the piezoelectric element 52a is discharged. An emitter of the PNP transistor 42b is connected to the supply line of the driving signal COM, and a base of the PNP transistor 42b is connected to the supply line of the voltage waveform signal COM'. A collector of the PNP transistor 42b is connected to a ground or the capacitor 43 through the second selection circuit 45. The PNP transistor 42b is turned on when the voltage of the voltage waveform signal COM' decreases, and amplifies the current of the voltage waveform signal COM' and pulls the current from the piezoelectric element 52a. During the current amplification, the current is pulled from the emitter. Accordingly, the emitter of the PNP transistor 42b corresponds to a pull terminal for pulling a current. In addition, a charge is emitted from the collector of the PNP transistor 42b to the ground or the capacitor 43 through the second selection circuit 45. Accordingly, the collector of the PNP transistor 42b corresponds to an emission terminal for emitting the charge. The ground or the capacitor 43 corresponds to a charge emission destination. Furthermore, the voltage waveform signal COM' (analog signal) is input to the base of the PNP transistor 42b. That is, the base of the PNP transistor 42b corresponds to an analog signal input terminal to which an analog signal is input.

As will be apparent from the above description, in the current amplifying circuit 42, the operations of the transistors 42a and 42b are controlled by the voltage waveform signal COM' output from the waveform generating circuit 41. As a result, the voltage of the driving signal COM output from the current amplifying circuit 42 is slightly changed during the current amplification, but it becomes almost equal to the voltage of the voltage waveform signal COM'.

Regarding Capacitor 43

The capacitor 43 functions as a current source with respect to the NPN transistor 42a. Meanwhile, the capacitor 43 functions as a charge emission destination with respect to the PNP transistor 42b. In this embodiment, the capacitor 43 has a regular voltage of 24 V, and a positive terminal thereof is connected to the second power generating circuit 82 through a resistor 82a. Accordingly, the capacitor 43 is gradually charged with the second power supply voltage of 24 V, and functions as a 24 V current source. In addition, the positive terminal of the capacitor 43 is connected to the collector of the NPN transistor 42a through the first selection circuit 44, and the collector of the PNP transistor 42b through the second selection circuit 45.

Although details will be given below, the first selection circuit 44 connects the capacitor 43 to the collector of the NPN transistor 42a when the voltage of the voltage waveform signal COM' is less than a predetermined voltage. When the voltage of the voltage waveform signal COM' is equal to or more than the predetermined voltage, the first selection circuit 44 connects the first power generating circuit 81 to the collector of the NPN transistor 42a. As described above, the first power generating circuit 81 functions as a current source with respect to the NPN transistor 42a, similarly to the capacitor 43. Accordingly, the first power supply voltage generated by the first power generating circuit 81 is 42 V. A voltage to be supplied from the capacitor 43 is 24 V, which is lower than the first power supply voltage. Accordingly, the first power generating circuit 81 corresponds to a first current source at a first voltage, and the capacitor 43 corresponds to a second current source at a second voltage lower than the first voltage.

The second selection circuit 45 connects the ground to the collector of the PNP transistor 42b when the voltage of the voltage waveform signal COM' equal to or less than the predetermined voltage. When the voltage of the voltage waveform signal COM' is more than the predetermined voltage, the second selection circuit 45 connects the capacitor 43 to the collector of the PNP transistor 42b. As described above, the ground and the capacitor 43 correspond to a charge emission destination with the PNP transistor 42b. The ground is at 0 V, and the voltage to be supplied from the capacitor 43 is 24 V. That is, the voltage to be supplied from the capacitor 43 is higher than the voltage of the ground. Accordingly, the ground corresponds to a first charge emission destination at a first voltage, and the capacitor 43 corresponds to a second charge emission destination at a second voltage higher than the first voltage.

Regarding First Selection Circuit 44

As described above, the first selection circuit 44 selectively connects the first power generating circuit 81 and the capacitor 43 serving as the current source to the collector of the NPN transistor 42a according to the voltage of the voltage waveform signal COM'. That is, the first selection circuit 44 corresponds to a current source connector that selects at least one current source from among a plurality of current sources according to the voltage of the analog signal, and connects the selected current source to the current source terminal. The first selection circuit 44 has a first PNP transistor 44a, a first NPN transistor 44b, and a first diode 44c.

The first PNP transistor 44a functions as a current source switch, and controls connection or disconnection of the first power generating circuit 81 with respect to the collector of the NPN transistor 42a in the current amplifying circuit 42. An emitter of the first PNP transistor 44a is connected to the first power generating circuit 81, and a collector of the first PNP transistor 44a is connected to the collector of the NPN transistor 42a. A base of the first PNP transistor 44a is connected to a collector of the first NPN transistor 44b through a resistor 44d.

The first NPN transistor 44b functions as a control signal generating element, and generates a control signal for controlling the operation of the first PNP transistor 44a on the basis of the voltage waveform signal COM' (analog signal). An emitter of the first NPN transistor 44b is connected to the positive terminal of the capacitor 43, and a base of the first NPN transistor 44b is connected to the supply line of the voltage waveform signal COM' through a resistor 44e. A collector of the first NPN transistor 44b is connected to the base of the first PNP transistor 44a through the resistor 44d, as described above.

The first diode 44c supplies a charge accumulated in the capacitor 43 to the collector of the NPN transistor 42a when the first power generating circuit 81 is not connected to the NPN transistor 42a in the current amplifying circuit 42. That is, the first diode 44c allows charge movement to the NPN transistor 42a. Meanwhile, the first diode 44c blocks the supply of the first power supply voltage to the capacitor 43 when the first power generating circuit 81 is connected to the collector of the NPN transistor 42a. To this end, a cathode of the first diode 44c is connected to the collector of the NPN transistor 42a in the current amplifying circuit 42, and an anode of the first diode 44c is connected to the positive terminal of the capacitor 43. The first diode 44c is a kind of an element that blocks charge movement in a predetermined direction, and corresponds to a current source diode.

In the first selection circuit 44 having the above configuration, the emitter of the first NPN transistor 44b is connected to the positive terminal of the capacitor 43. Accordingly, when the voltage of the voltage waveform signal COM' is less than a predetermined voltage (a voltage obtained by adding 0.6 V to the voltage to be supplied from the capacitor 43), the first NPN transistor 44b is turned off. In this case, the potentials of the emitter and the base of the first PNP transistor 44a are equalized, and thus the first PNP transistor 44a is also turned off. As a result, the capacitor 43 serving as a second current source is connected to the NPN transistor 42a in the current amplifying circuit 42. That is, the NPN transistor 42a in the current amplifying circuit 42 and the capacitor 43 are connected with each other through the first diode 44c to allow charge movement.

If the voltage of the voltage waveform signal COM' is equal to or more than the predetermined voltage, the first NPN transistor 44b is turned on. In this case, the emitter and the collector of the first NPN transistor 44b substantially have the same voltage. That is, the voltages of the emitter and the collector are equalized at the voltage to be supplied from the capacitor 43. Accordingly, the voltage of the base of the first PNP transistor 44a decreases to the voltage to be supplied from the capacitor 43. Then, the first PNP transistor 44a is turned on, and the emitter and the collector thereof substantially have the same voltage. That is, the voltages of the emitter and the collector are equalized at the first power supply voltage. Specifically, the first power generating circuit 81 serving as a first current source is connected to the NPN transistor 42a in the current amplifying circuit 42. At this time, the voltage on the cathode of the first diode 44c becomes sufficiently higher than the voltage on the anode of the first diode 44c. For this reason, charge movement from the capacitor 43 to the NPN transistor 42a is not performed. That is, the capacitor 43 and the NPN transistor 42a are electrically disconnected from each other.

Regarding Second Selection Circuit 45

As described above, the second selection circuit 45 selectively connects the collector of the PNP transistor 42b to the ground and the capacitor 43 serving as the charge emission destination according to the voltage of the voltage waveform signal COM'. Accordingly, the second selection circuit 45 corresponds to a charge emission destination connector that selects at least one charge emission destination from among a plurality of charge emission destinations according to a voltage of an analog signal, and connects the selected charge emission destination to an emission terminal. The second selection circuit 45 includes a second NPN transistor 45a, a second PNP transistor 45b, and a second diode 45c.

The second NPN transistor 45a functions as a charge emission destination switch, and controls connection or disconnection from the ground with respect to the collector of the PNP transistor 42b in the current amplifying circuit 42. A collector of the second NPN transistor 45a is connected to the collector of the PNP transistor 42b, and an emitter of the second NPN transistor 45a is connected to the ground. A base of the second NPN transistor 45a is connected to a collector of the second PNP transistor 45b through a resistor 45d.

The second PNP transistor 45b functions as a control signal generating element, and generates a control signal for controlling the operation of the second NPN transistor 45a on the basis of the voltage waveform signal COM' (analog signal). An emitter of the second PNP transistor 45b is connected to the positive terminal of the capacitor 43, and a base of the second PNP transistor 45b is connected to the supply line of the voltage waveform signal COM' through a resistor 45e. A collector of the second PNP transistor 45b is connected to the base of the second NPN transistor 45a through the resistor 45d, as described above.

The second diode 45c moves a charge emitted from the collector of the PNP transistor 42b to the capacitor 43 when the ground is not connected to the collector of the PNP transistor 42b in the current amplifying circuit 42. That is, the second diode 45c allows charge movement to the capacitor 43. Meanwhile, the second diode 45c blocks emission of the charge accumulated in the capacitor 43 when the ground is connected to the collector of the PNP transistor 42b. To this end, a cathode of the second diode 45c is connected to the positive terminal of the capacitor 43, and an anode of the second diode 45c is connected to the collector of the PNP transistor 42b. The second diode 45c is a kind of element that blocks charge movement in a predetermined direction, and corresponds to a discharging diode.

In the second selection circuit 45 having the above configuration, the emitter of the second PNP transistor 45b is connected to the positive terminal of the capacitor 43. Accordingly, when the voltage of the voltage waveform signal COM' is higher than a predetermined voltage (a voltage obtained by subtracting 0.6 V from the voltage to be supplied from the capacitor 43), the second PNP transistor 45b is turned off. In this case, the potentials of the emitter and the base of the second NPN transistor 45a are equalized, and thus the second NPN transistor 45a is also turned off. As a result, the capacitor 43 serving as a second charge emission destination is connected to the PNP transistor 42b in the current amplifying circuit 42. That is, the PNP transistor 42b in the current amplifying circuit 42 and the capacitor 43 are connected with each other through the second diode 45c to allow charge movement.

If the voltage of the voltage waveform signal COM' is equal to or less than the predetermined voltage, the second PNP transistor 45b is turned on. In this case, the emitter and the collector of the second PNP transistor 45b substantially have the same voltage. That is, the voltages of the emitter and the collector are equalized at the voltage to be supplied from the capacitor 43. Accordingly, the voltage of the base of the second NPN transistor 45a increases to the voltage to be supplied from the capacitor 43. Then, the second NPN transistor 45a is turned on, and the emitter and the collector substantially have the same voltage. That is, the voltages of the emitter and the collector are equalized at the voltage of the ground. As a result, the ground serving as a first charge emission destination is connected to the PNP transistor 42b in the current amplifying circuit 42. At this time, the voltage on the cathode of the second diode 45c becomes sufficiently higher than the voltage on the anode of the second diode 45c. For this reason, no charge is moved from the capacitor 43 to the PNP transistor 42b (ground). That is, the capacitor 43 and the PNP transistor 42b are electrically disconnected from each other.

Operation of Printer 1

Next, the operation of the printer 1 will be described. The printer 1 is characterized by the operation of the driving signal generating circuit 40 during printing. In summary, first, the DAC data is output from the printer-side controller 70 to the waveform generating circuit 41, and the voltage waveform signal COM' (analog signal) having a voltage change pattern for determining the operation of the piezoelectric element 52a is generated. While the piezoelectric element 52a is charged, the first power generating circuit 81 and the capacitor 43 are selected according to the voltage of the voltage waveform signal COM', and the current of the voltage waveform signal COM' is amplified by means of the selected circuit and element. Then, the current is pushed toward the piezoelectric element 52a. Meanwhile, while the piezoelectric element 52a is discharged, the capacitor 43 and the ground are selected according to the voltage of the voltage waveform signal COM'. Then, the current of the voltage waveform signal COM' is amplified, the current is pulled from the piezoelectric element 52a, and the charge is emitted to the selected unit and element.

With this configuration, heat generation from the transistors 44a and 44b in the first selection circuit 44 or from the transistors 45a and 45b in the second selection circuit 45 is suppressed. This is because the transistors perform switching operations. For this reason, a countermeasure against heat, such as a large heat sink, does not need to be provided. With respect to the transistors 42a and 42b of the current amplifying circuit 42, the voltage of the current source or the voltage of the charge emission destination is switched according to the voltage of the voltage waveform signal COM'. For this reason, an emitter-collector voltage difference can be reduced, compared with a case in which a current source at a single voltage is used or the ground only serves as a charge emission destination. Accordingly, heat generation from the transistors 42a and 42b can be suppressed, and power consumption can be suppressed. In addition, a heat sink can be compact. Furthermore, part of the charges emitted when the piezoelectric element 52a is discharged is accumulated in the capacitor 43 serving as a second current source. Therefore, the charge can be effectively used, and thus power consumption can be suppressed. Hereinafter, the operation of the printer 1 will be described with particular emphasis on this point.

Regarding Operation During Charging

Figure 3:
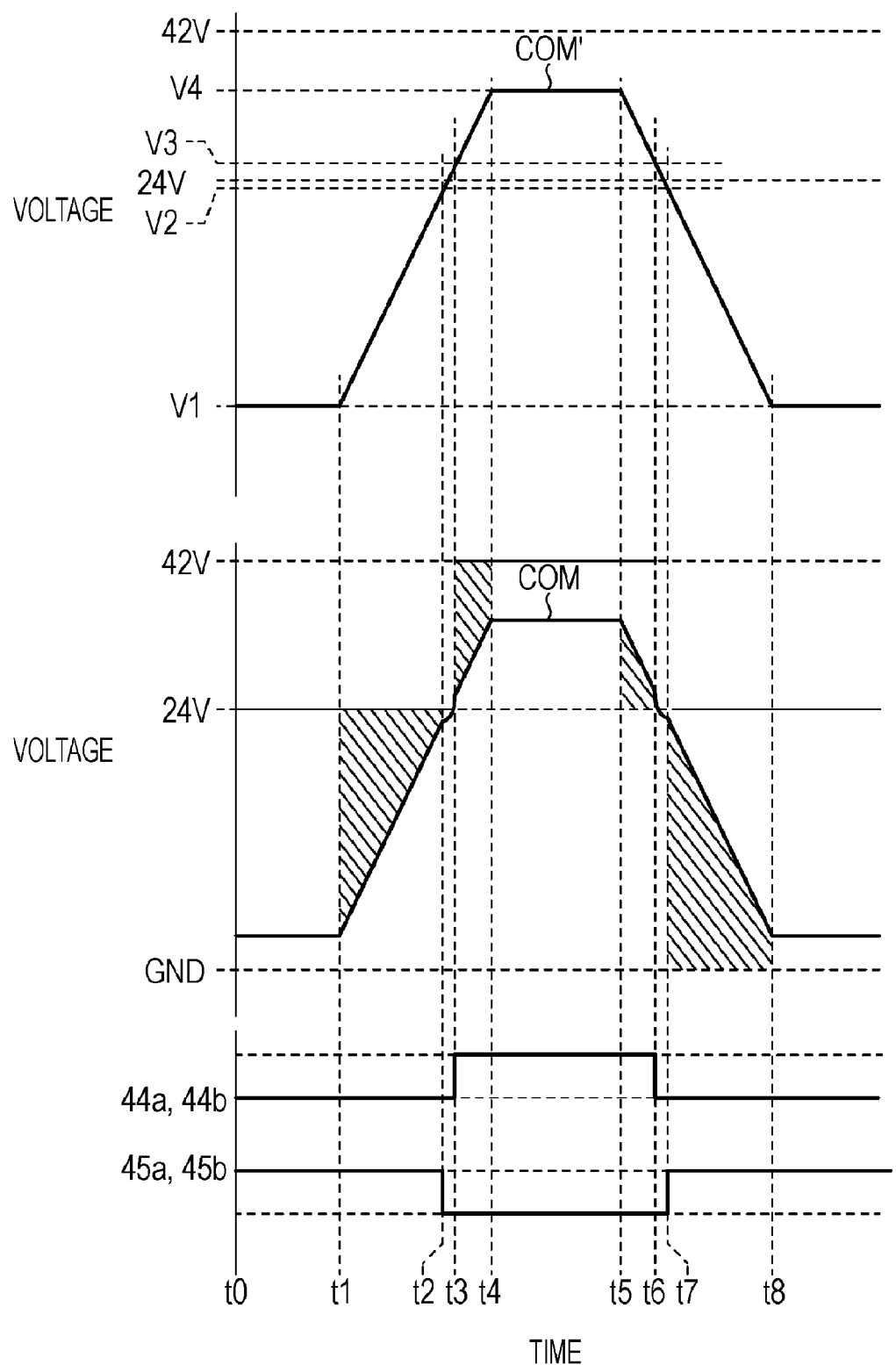
FIG. 3 is a diagram illustrating a voltage waveform signal and a driving signal according to the first embodiment.

First, the operation when the piezoelectric element 52a is charged will be described. For convenience, a case in which the piezoelectric element 52a is controlled by using a voltage waveform signal COM' having a trapezoidal voltage change pattern will be described, as shown in FIG. 3.

Figure 4:
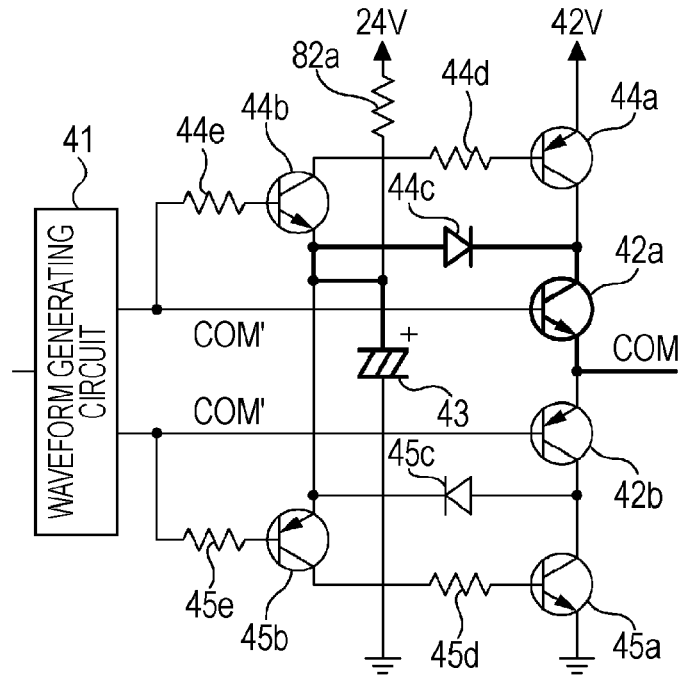
FIG. 4 is a diagram schematically illustrating a state where a capacitor is selected as a current source.

During a period from a timing t0 to a timing t1, the printer-side controller 70 outputs DAC data at a voltage V1 to the waveform generating circuit 41. Accordingly, the waveform generating circuit 41 outputs a voltage waveform signal COM' at a voltage V1 during the corresponding period. The voltage waveform signal COM' is input to the base of the first NPN transistor 44b in the first selection circuit 44. Here, the voltage V1 is sufficiently lower than the voltage (24 V) to be supplied from the capacitor 43. For this reason, in the first selection circuit 44, the first NPN transistor 44b and the first PNP transistor 44a are both turned off. Then, as indicated by a bold line in FIG. 4, the charge accumulated in the capacitor 43 is supplied to the collector of the NPN transistor 42a in the current amplifying circuit 42 through the first diode 44c. That is, the collector of the NPN transistor 42a is substantially at 24V. Moreover, the NPN transistor 42a is turned off during the corresponding period. This is because the emitter voltage (the voltage of the driving signal COM) and the base voltage (the voltage of the voltage waveform signal COM') in the NPN transistor 42a are substantially equal to each other.

During a period from the timing t1 to a timing t4, the printer-side controller 70 updates the contents of the DAC data so as to increase the voltage of the voltage waveform signal COM' by a predetermined value. Accordingly, the voltage of the voltage waveform signal COM', which is the voltage V1 at the timing t1, becomes a voltage V4 at the timing t4. Then, the NPN transistor 42a in the current amplifying circuit 42 also operates to amplify the current of the voltage waveform signal COM' and output the amplified signal as the driving signal COM. That is, the NPN transistor 42a pushes the current to the piezoelectric element 52a. The piezoelectric element 52a is charged with the pushed current.

Here, during a period until the voltage of the voltage waveform signal COM' reaches a predetermined voltage (a voltage higher than the voltage supplied from the capacitor 43 by 0.6 V), that is, a period from the timing t1 to t3, the transistors 44a and 44b in the first selection circuit 44 are kept turned off. For this reason, the capacitor 43 serving as a second current source is connected to the collector of the NPN transistor 42a in the current amplifying circuit 42 through the first diode 44c. Therefore, the charge accumulated in the capacitor 43 is used to amplify the current during the corresponding period.

Figure 5:
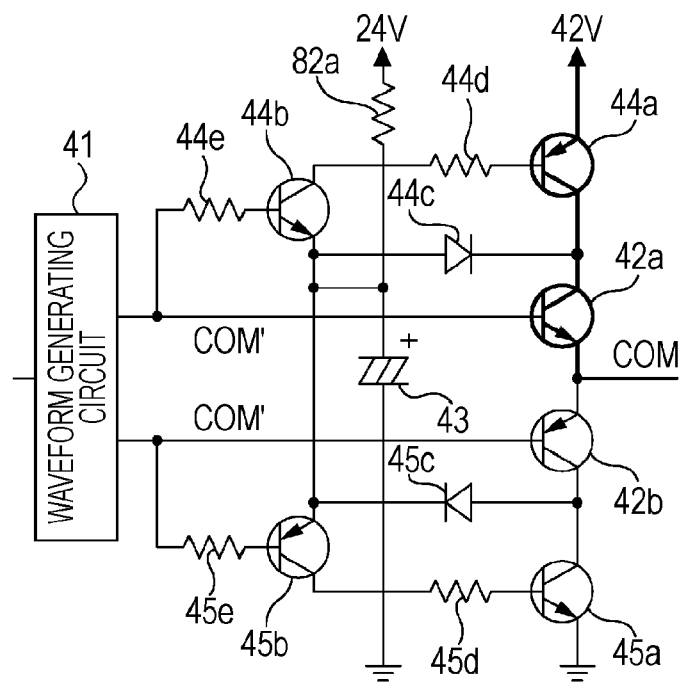
FIG. 5 is a diagram schematically illustrating a state where a first power generating circuit is selected as a current source.

If the voltage of the voltage waveform signal COM' becomes equal to or more than the predetermined voltage, the transistors 44a and 44b in the first selection circuit 44 are turned on. Specifically, the transistors 44a and 44b are turned on during a period from the timing t3 to a timing t6. Accordingly, as indicated by a bold line in FIG. 5, the first power generating circuit 81 is connected to the collector of the NPN transistor 42a in the current amplifying circuit 42 through the first PNP transistor 44a. Then, during a period from the timing t3 to the timing t4, the current of the voltage waveform signal COM' is amplified. In this amplification, the first power supply voltage is used.

Here, power consumption of the NPN transistor 42a in the current amplifying circuit 42 will be described. Power consumption can be represented as a product of a difference in voltage between the collector and the emitter of the NPN transistor 42a and the amplified current. As described above, during the period from the timing t1 to the timing t3, the current is amplified by using the charge accumulated in the capacitor 43, and during the period from the timing t3 to the timing t4, the current is amplified by using the first power supply voltage. The difference in voltage between the collector and the emitter of the NPN transistor 42a is indicated by a hatched region in the middle of FIG. 3. By multiplying the voltage difference by a push current supplied to the piezoelectric element 52a, power consumption of the NPN transistor 42a is calculated. In the example shown in FIG. 3, the current source is switched at the timing t3. Therefore, it can be seen that power consumption can be suppressed, compared with a case in which a single power supply voltage (for example, 42 V) is used. That is, during the period from the timing t1 to the timing t3, since the current source operates at 24 V, the voltage difference can be reduced by the amount corresponding to the difference in the case in which the single power supply voltage is used.

The first selection circuit 44 uses, as switching elements, two transistors (first PNP transistor 44a and first NPN transistor 44b) for switching the current source. That is, during the turned-on state, the collector voltage and the emitter voltage are substantially equalized. Accordingly, power consumption can be suppressed so as to be sufficiently low. In addition, the first diode 44c which is provided between the capacitor 43 and the NPN transistor 42a has sufficiently low power consumption. Therefore, a countermeasure against heat generation, such as a heat sink, does not need to be provided for these elements, and thus the apparatus can be compact. With respect to the NPN transistor 42a in the current amplifying circuit 42, power consumption can be suppressed by switching of the current source. Therefore, a small heat sink can be used, compared with the related art.

Regarding Operation During Discharging

Next, the operation when the piezoelectric element 52a is discharged will be described. During a period from a timing t5 to a timing t8, the printer-side controller 70 updates the contents of the DAC data so as to decrease the voltage of the voltage waveform signal COM' by a predetermined value. Accordingly, the voltage of the voltage waveform signal COM', which is the voltage V4 at the timing t5, becomes the voltage V1 at the timing t8.

Figure 6:
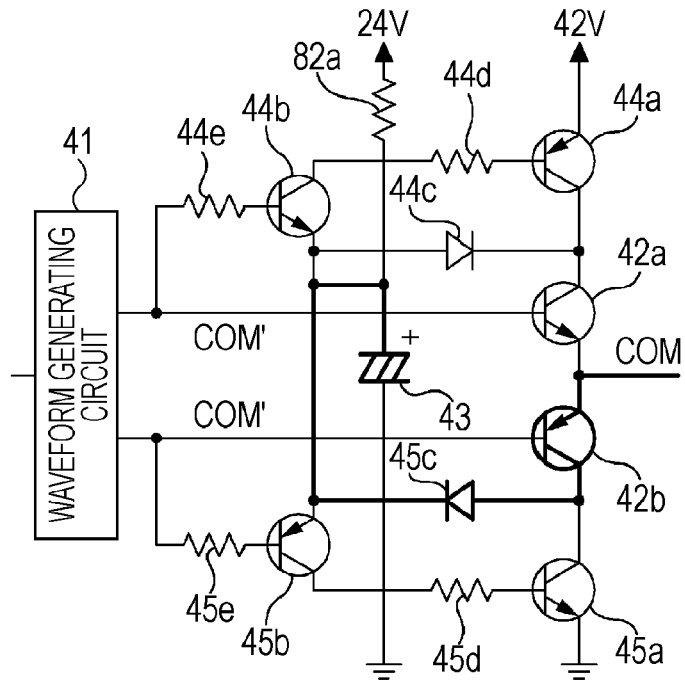
FIG. 6 is a diagram schematically illustrating a state where a capacitor is selected as a charge emission destination.

Then, the PNP transistor 42b in the current amplifying circuit 42 also operates to amplify the current of the voltage waveform signal COM' and outputs the amplified signal as the driving signal COM. That is, the PNP transistor 42b pulls a current from the piezoelectric element 52a. The piezoelectric element 52a is discharged by pulling of the current. Here, during a period until the voltage of the voltage waveform signal COM' reaches a predetermined voltage (a voltage lower than the voltage supplied from the capacitor 43 by 0.6 V), that is, a period from the timing t5 to the timing t7, the transistors 45a and 45b in the second selection circuit 45 are kept turned off. For this reason, the capacitor 43 serving as a second charge emission destination is connected to the collector of the PNP transistor 42b in the current amplifying circuit 42 through the second diode 45c. Accordingly, as indicated by a bold line in FIG. 6, the charge is emitted from the collector of the PNP transistor 42b to the capacitor 43 through the second diode 45c. The charge is accumulated in the capacitor 43. The charge accumulated in the capacitor 43 is used when the piezoelectric element 52a is charged. Moreover, second power generating circuit 82 is connected to the positive terminal of the capacitor 43, but the current is limited by the resistor 82a. Therefore, the charge to be moved when the piezoelectric element 52a is discharged can be accumulated in the capacitor 43.

Figure 7:
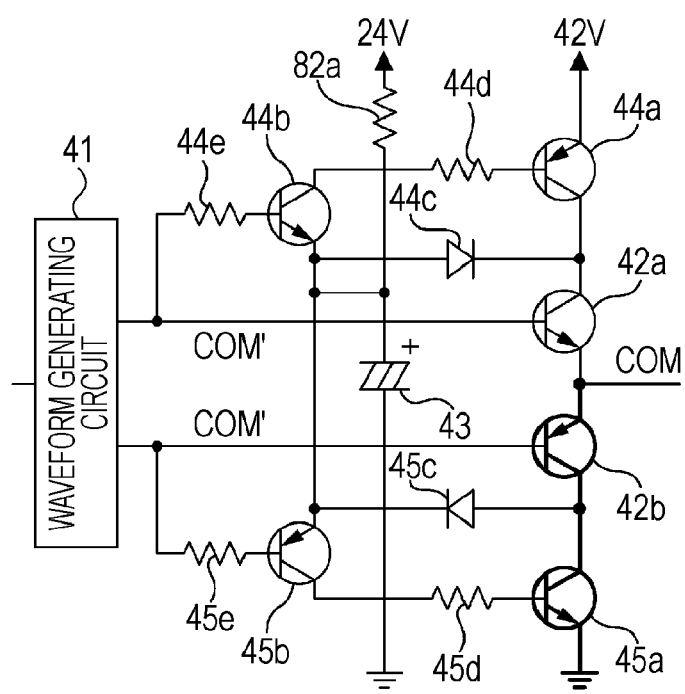
FIG. 7 is a diagram schematically illustrating a state where a ground is selected as a charge emission destination.

If the voltage of the voltage waveform signal COM' is equal to or less than the predetermined voltage, the transistors 45a and 45b in the second selection circuit 45 are turned on. Specifically, during the period from the timing t7 to the timing t8, the transistors 45a and 45b are turned on. Accordingly, as indicated by a bold line in FIG. 7, the ground is connected to the collector of the PNP transistor 42b in the current amplifying circuit 42 through the second NPN transistor 45a. Therefore, during the period from the timing t7 to the timing t8, although the current of the voltage waveform signal COM' is amplified, the charge from the piezoelectric element 52a is emitted to the ground.

Here, power consumption of the PNP transistor 42b in the current amplifying circuit 42 will be described. Power consumption can be represented as a product of a difference in voltage between the collector and the emitter of the PNP transistor 42b and the amplified current. As described above, during the period from the timing t5 to the timing t7, the positive terminal of the capacitor 43 is connected to the collector of the PNP transistor 42b through the second diode 45c. In addition, during the period from the timing t7 to the timing t8, the ground is connected to the collector of the PNP transistor 42b through the second NPN transistor 45a. For this reason, the charge from the piezoelectric element 52a is emitted to the capacitor 43 during the period from the timing t5 to the timing t7, and is emitted to the ground during the period from the timing t7 to the timing t8.

The difference in voltage between the collector and the emitter in the PNP transistor 42b is indicated by a hatched region in the middle of FIG. 3. By multiplying the voltage difference by the pull current from the piezoelectric element 52a, power consumption of the PNP transistor 42b is calculated. In the example shown in FIG. 3, the charge emission destination is switched at the timing t7. Accordingly, it can be seen that power consumption can be suppressed, compared with a case in which the ground only serves as a charge emission destination. That is, during the period from the timing t5 to the timing t7, since the charge emission destination is at 24 V, the voltage difference can be reduced by the difference from a case in which the ground is only used.

The second selection circuit 45 also uses, as switching elements, two transistors (second NPN transistor 45a and second PNP transistor 45b) for switching the charge emission destination. Accordingly, power consumption can be suppressed so as to be sufficiently low. In addition, the second diode 45c which is provided between the capacitor 43 and the PNP transistor 42b has sufficiently low power consumption. Therefore, a countermeasure against heat generation, such as a heat sink, does not need to be provided for these elements, and thus the apparatus can be compact. With respect to the PNP transistor 42b in the current amplifying circuit 42, power consumption can be suppressed by switching of the current source. Therefore, a small heat sink can be used, compared with the related art.

Conclusion of First Embodiment

As will be apparent from the above description, in the printer 1 according to the first embodiment, the first selection circuit 44 selectively connects a plurality of current sources at different voltages (the first power generating circuit 81 and the capacitor 43) to the collector of the NPN transistor 42a (a charging transistor of the piezoelectric element 52a) in the current amplifying circuit 42. Accordingly, a current source suitable for the voltage of the voltage waveform signal can be used, and power consumption of the NPN transistor 42a can be suppressed. Therefore, a heat sink can be compact. Furthermore, a transistor package having low power consumption may be used.

When selecting a plurality of current sources, the first selection circuit 44 uses, as switching elements, bipolar transistors (the first PNP transistor 44a and the first NPN transistor 44b). For this reason, heat generation during the operation can be suppressed, and a heat sink can be removed, thereby making the apparatus compact.

The first selection circuit 44 connects a current source at a lower voltage (the capacitor 43) to the collector of the NPN transistor 42a through the first diode 44c, and connects a current source at a higher voltage (the first power generating circuit 81) to the collector of the NPN transistor 42a through the current source switch (the first PNP transistor 44a). Accordingly, by controlling the current source switch, a current source to be connected to the collector of the NPN transistor 42a can be selected. Therefore, the configuration can be simplified and the control can be easily performed.

The second selection circuit 45 selectively connects a plurality of charge emission destinations at different voltages (the ground and the capacitor 43) to the collector of the PNP transistor 42b (a discharging transistor of the piezoelectric element 52a) in the current amplifying circuit 42. Therefore, power consumption of the PNP transistor 42b can be suppressed, and a heat sink can be compact. Furthermore, a transistor package having low power consumption can be used.

When selecting a plurality of charge emission destinations, the second selection circuit 45 uses bipolar transistors (the second NPN transistor 45a and the second PNP transistor 45b) as switching elements. Therefore, heat generation during the operation can be suppressed, and a heat sink can be removed, thereby making the apparatus compact.

The second selection circuit 45 connects a charge emission destination at a higher voltage (the capacitor 43) to the collector of the PNP transistor 42b through the second diode 45c, and connects a charge emission destination at a lower voltage (the ground) to the collector of the PNP transistor 42b through the charge emission destination switch (the second NPN transistor 45a). Accordingly, by controlling the charge emission destination switch, a charge emission destination to be connected to the collector of the PNP transistor 42b can be selected. Therefore, the configuration can be simplified, and the control can be easily performed.

With respect to the current sources, the printer 1 uses the first power generating circuit 81 (a power supply circuit) as a first current source at a higher voltage, and uses the capacitor 43 as a second current source at a lower voltage. Accordingly, even if the charge accumulated in the capacitor 43 is consumed and charge supply becomes difficult, a charge can be supplied from the first power generating circuit 81. Therefore, the reliability can be improved.

SECOND EMBODIMENT

In the printer 1 according to the first embodiment, as shown in FIG. 3, if the voltage of the voltage waveform signal COM' is higher than the voltage (24 V) supplied from the capacitor 43 by 0.6 V or more (t3 to t6), the first power generating circuit 81 is selected as a current source. If the voltage of the voltage waveform signal COM' is lower than the voltage supplied from the capacitor 43 by 0.6 V or more (t0 to t2, t7 and later), the ground is selected as a charge emission destination. In this case, though for a very short time, when the piezoelectric element 52a is charged, the voltage of the voltage waveform signal COM' becomes higher than the voltage of the current source. In addition, when the piezoelectric element 52a is discharged, the voltage of the voltage waveform signal COM' becomes lower than the voltage of the charge emission destination. Accordingly, the voltage change pattern of the driving signal COM may be distorted.

Figure 8:
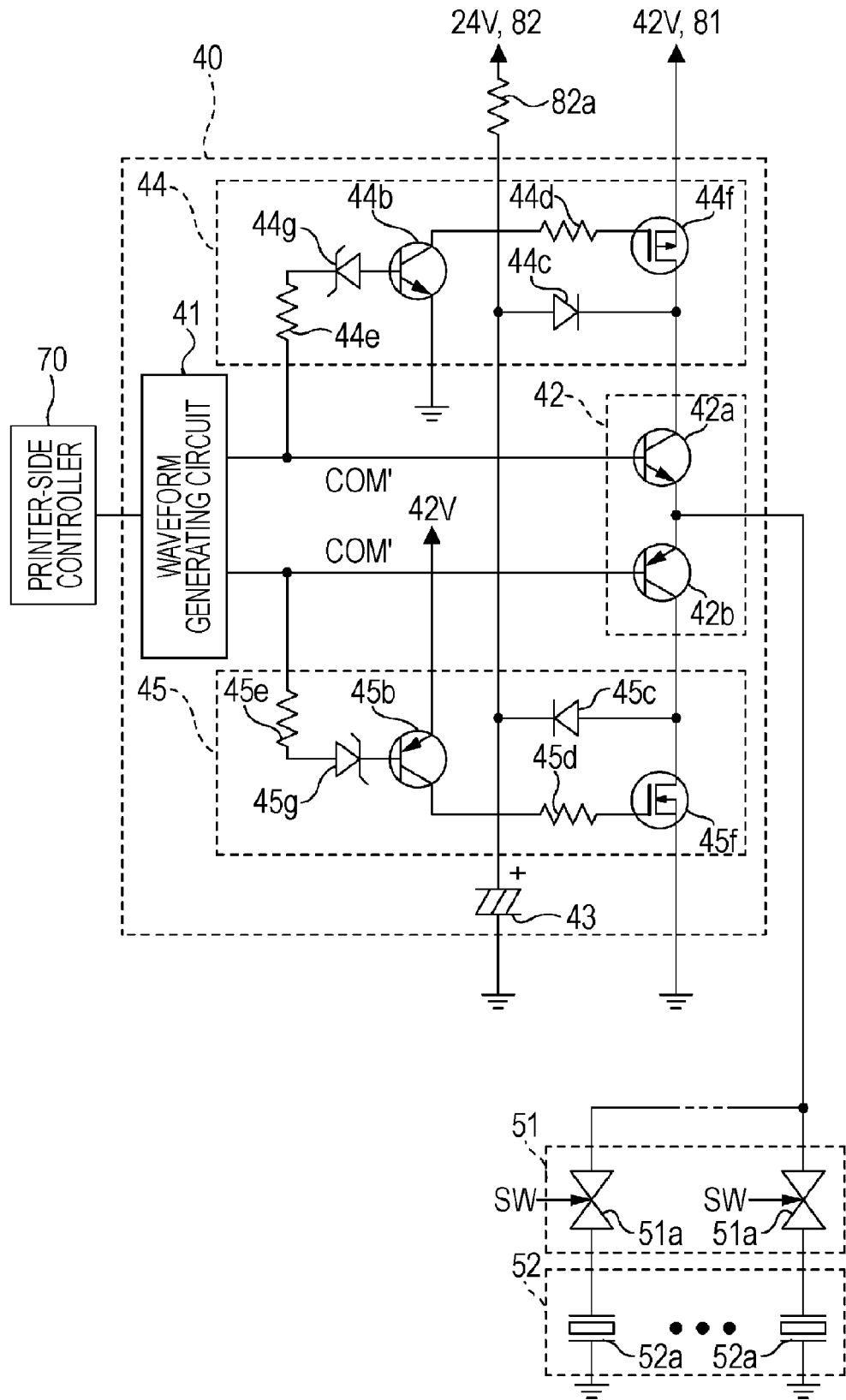
FIG. 8 is a diagram illustrating a driving signal generating circuit and a peripheral portion according to a second embodiment of the invention.

The second embodiment has been made in consideration of this problem, and is designed to optimize switching of a current source or a charge emission destination. FIG. 8 is a diagram illustrating a driving signal generating circuit 40 in a printer 1 according to the second embodiment. Moreover, other parts of the printer 1 are the same as those in the first embodiment, and thus the descriptions thereof will be omitted. In the second embodiment, similarly to the first embodiment, a driving signal generating circuit 40 has a waveform generating circuit 41, a current amplifying circuit 42, a capacitor 43, a first selection circuit 44, and a second selection circuit 45. Of these, the waveform generating circuit 41, the current amplifying circuit 42, and the capacitor 43 have the same configuration as those in the first embodiment.

Regarding First Selection Circuit 44

The first selection circuit 44 has the following differences from that in the first embodiment. That is, a first FET 44f, instead of the first PNP transistor 44a, is used as a current source switch, and a first Zener diode 44g is provided between a base of a first NPN transistor 44b and a resistor 44e. In addition, an emitter of the first NPN transistor 44b is connected to the ground.

The first FET 44f has the same function as the first PNP transistor 44a. That is, the first FET 44f selectively connects the first power generating circuit 81 to the collector of the NPN transistor 42a in the current amplifying circuit 42. A cathode of the first Zener diode 44g is connected to the supply line of the voltage waveform signal COM' through the resistor 44e, and an anode of the first Zener diode 44g is connected to the base of the first NPN transistor 44b. The first Zener diode 44g is an element for controlling the operation of the first NPN transistor 44b. Specifically, the first Zener diode 44g blocks application of the voltage waveform signal COM' to the first NPN transistor 44b when a difference between the voltage of the voltage waveform signal COM' and the base voltage of the first NPN transistor 44b is less than a Zener voltage. Meanwhile, when the difference between the voltage of the voltage waveform signal COM' and the base voltage of the first NPN transistor 44b is equal to or more than the Zener voltage, the first Zener diode 44g allows application of the voltage waveform signal COM' to the first NPN transistor 44b.

In the first selection circuit 44 having the above configuration, when the voltage waveform signal COM' is at a low voltage, and the difference between the voltage of the voltage waveform signal COM' and the base voltage of the first NPN transistor 44b is less than the Zener voltage, the first NPN transistor 44b is turned off. Then, a gate voltage is at H level, and the first FET 44f is also turned off. Accordingly, the capacitor 43 is connected to the collector of the NPN transistor 42a in the current amplifying circuit 42 through the first diode 44c.

If the voltage of the voltage waveform signal COM' increases and becomes more than the base voltage of the first NPN transistor 44b by the Zener voltage or more, the first Zener diode 44g is conducted. Then, the base voltage of the first NPN transistor 44b is substantially equalized to the voltage of the voltage waveform signal COM', and the first NPN transistor 44b is turned on. That is, the collector and the emitter are conducted. Accordingly, the gate voltage of the first FET 44f decreases and is at L level, the source and the drain are conducted. As a result, the first power generating circuit 81 is connected to the collector of the NPN transistor 42a in the current amplifying circuit 42 through the first FET 44f.

In this way, the first Zener diode 44g and the first NPN transistor 44b function as a control circuit for controlling the operation of the first FET 44f. The control circuit outputs a control signal at H level to the gate of the first FET 44f when the voltage of the voltage waveform signal COM' is less than a predetermined voltage, and connects the capacitor 43 to the NPN transistor 42a. When the voltage of the voltage waveform signal COM' is equal to or more than the predetermined voltage, the control circuit outputs a control signal at L level to the gate of the first FET 44f, and connects the first power generating circuit 81 to the NPN transistor 42a.

Regarding Second Selection Circuit 45

The second selection circuit 45 has the following differences from that in the first embodiment. That is, a second FET 45f, instead of the second NPN transistor 45a, is used as a charge emission destination switch, and a second Zener diode 45g is provided between a base of a second PNP transistor 45b and a resistor 45e. In addition, an emitter of the second PNP transistor 45b is connected to the first power generating circuit 81.

The second FET 45f has the same function as the second NPN transistor 45a. That is, the second FET 45f selectively connects the ground to the collector of the PNP transistor 42b in the current amplifying circuit 42. An anode of the second Zener diode 45g is connected to the supply line of the voltage waveform signal COM' through the resistor 45e, and a cathode of the second Zener diode 45g is connected to the base of the second PNP transistor 45b. The second Zener diode 45g is an element for controlling the operation of the second PNP transistor 45b. Specifically, the second Zener diode 45g blocks application of the voltage waveform signal COM' to the second PNP transistor 45b when a difference between the voltage of the voltage waveform signal COM' and the base voltage of the second PNP transistor 45b is less than a Zener voltage. Meanwhile, when the difference between the voltage of the voltage waveform signal COM' and the base voltage of the second PNP transistor 45b is equal to or more than the Zener voltage, the second Zener diode 45g allows application of the voltage waveform signal COM' to the second PNP transistor 45b.

In the second selection circuit 45 having the above configuration, when the voltage waveform signal COM' is at a high voltage, and the difference between the voltage of the voltage waveform signal COM' and the base voltage of the second PNP transistor 45b is less than the Zener voltage, the second PNP transistor 45b is turned off. Then, a gate voltage is at L level, and the second FET 45f is also turned off. Accordingly, the capacitor 43 is connected to the collector of the PNP transistor 42b in the current amplifying circuit 42 through the second diode 45c.

If the voltage of the voltage waveform signal COM' decreases and is less than the base voltage of the second PNP transistor 45b by the Zener voltage or more, the second Zener diode 45g is conducted. Then, the base voltage of the second PNP transistor 45b is substantially equalized to the voltage of the voltage waveform signal COM', and the second PNP transistor 45b is turned on. That is, the collector and the emitter are conducted. Accordingly, the gate voltage of the second FET 45f increases and is at H level, and the source and the drain are conducted. As a result, the ground is connected to the collector of the PNP transistor 42b in the current amplifying circuit 42 through the second FET 45f.

In this way, the second Zener diode 45g and the second PNP transistor 45b function as a control circuit for controlling the operation of the second FET 45f. The control circuit outputs a control signal at L level to the gate of the second FET 45f when the voltage of the voltage waveform signal COM' is more than a predetermined voltage, and connects the capacitor 43 to the PNP transistor 42b. When the voltage of the voltage waveform signal COM' is equal to or less than the predetermined voltage, the control circuit outputs a control signal at H level to the gate of the second FET 45f, and connects the ground to the PNP transistor 42b.

Regarding Driving Signal COM to be Generated

Figure 9:
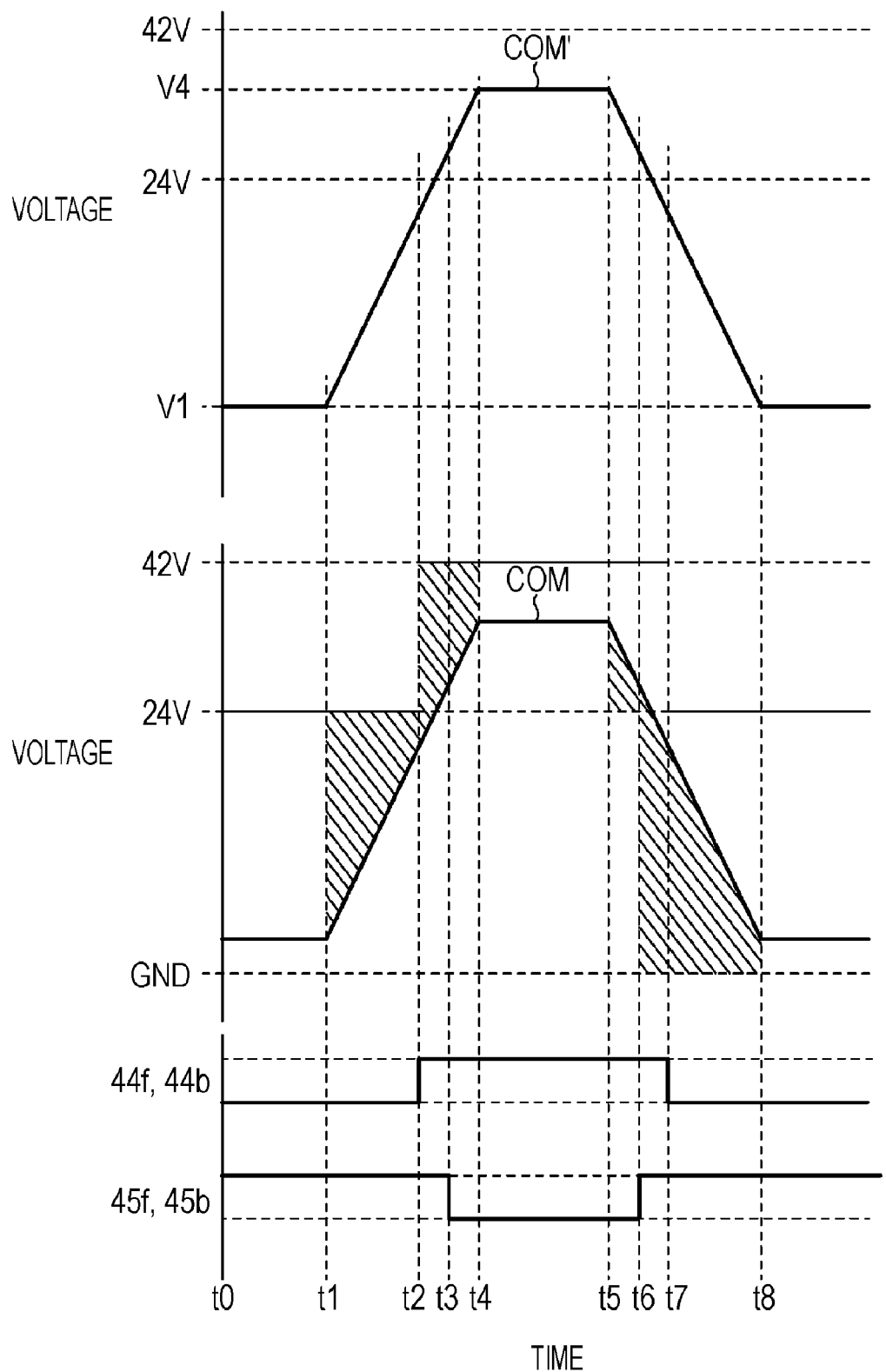
FIG. 9 is a diagram illustrating a voltage waveform signal and a driving signal according to the second embodiment.

In the driving signal generating circuit 40 according to the second embodiment, by appropriately setting the Zener voltage of the first Zener diode 44g or the second Zener diode 45g, the switching timing of the current source or the switching timing of the charge emission destination can be determined. In the example shown in FIG. 9, when the piezoelectric element 52a is charged, at a timing t2 immediately before the voltage of the voltage waveform signal COM' reaches 24 V, which is the voltage of the capacitor 43, the current source can be switched to the first power generating circuit 81. Similarly, when the piezoelectric element 52a is discharged, at a timing t6 immediately before the voltage of the voltage waveform signal COM' reaches 24 V, the charge emission destination can be switched to the ground.

Therefore, the current source or the charge emission destination can be switched at an appropriate timing, and distortion of the driving signal COM can be suppressed.

OTHER EMBODIMENTS

The foregoing embodiments have described the printing system having the printer 1, but they also include the disclosure of a liquid ejecting method. In addition, the foregoing embodiments are for the purpose of facilitating understanding the invention, and are not to be interpreted as limiting the invention. The invention can of course be altered and improved without departing from the gist thereof, and includes functional equivalents. In particular, the following embodiments are also included in the invention.

Regarding Current Amplifying Transistor

In the foregoing embodiments, the NPN transistor 42a and the PNP transistor 42b are illustrated as the charging transistor and the discharging transistor in the current amplifying circuit 42, respectively. However, any transistor may be used insofar as it can amplify the current of the voltage waveform signal COM' (analog signal).

Regarding Current Source or Charge Emission Destination

In the foregoing embodiments, a case in which a plurality of current sources or charge emission destinations at different voltages are selected has been described, current sources or charge emission destinations at the same voltage may be selected. Furthermore, with respect to the current source or the charge emission destination, the voltage is switched in two steps, but the voltage may be switched in three or more steps.

Regarding Driving Signal COM

In the foregoing embodiments, a case in which the printer 1 generates the single driving signal COM has been described, but the invention can be similarly to a printer 1 that generates a plurality of driving signals COM. That is, although a plurality of driving signals COM are generated, and required segments of the driving signals COM are selectively applied to the piezoelectric element 52a, the same advantages and effects can be obtained.

Regarding Other Apparatuses

In the foregoing embodiments, the printer 1 in which the head 52 is moved along with the carriage has been described, but the invention may be applied to a so-called line printer.

In the forgoing embodiments, the printer 1 has been described as a liquid ejecting apparatus, but the invention is not limited to the printer 1. For example, technology like that of the embodiments can also be applied to various apparatuses that employ ink jet technology, such as a color filter manufacturing apparatus, a dyeing apparatus, a fine processing apparatus, a semiconductor manufacturing apparatus, a surface processing apparatus, a three-dimensional shape forming machine, a liquid vaporizing apparatus, an organic EL manufacturing apparatus (in particular, a macromolecular EL manufacturing apparatus), a display manufacturing apparatus, a film forming apparatus, and a DNA chip manufacturing apparatus. Also, methods therefor and manufacturing methods thereof are within the scope of application.

What is claimed is:

1. A liquid ejecting apparatus, comprising:
    an element that is charged and discharged so as to perform an operation to eject a liquid;
    an analog signal generating unit that generates an analog signal having a voltage change pattern for determining the operation of the element;
    a charging transistor that amplifies a current of the analog signal while the element is charged, and pushes the amplified current toward the element, the charging transistor having a current source terminal, to which a current source is connected, and a push terminal for pushing the current;
    a current source connector that selects at least one current source from among a plurality of current sources according to a voltage of the analog signal, and connects the selected current source to the current source terminal,
    wherein the current source connector selects at least one current source from among the plurality of current sources at different voltages,
    wherein the plurality of current sources have a first current source at a first voltage and a second current source at a second voltage lower than the first voltage, and
    the current source connector includes:
    a current source switch that is provided between the first current source and the current source terminal, and
    a control circuit that outputs, to the current source switch, a control signal at a voltage level determined to control the operation of the current source switch on the basis of the voltage of the analog signal.

2. The liquid ejecting apparatus according to claim 1, wherein the current source connector switches a current source to be selected while the element is charged.

3. The liquid ejecting apparatus according to claim 1, wherein the plurality of current sources have a first current source at a first voltage and a second current source at a second voltage lower than the first voltage, and
    the current source connector includes
    a current source switch that is provided between the first current source and the current source terminal, and
    an element that is provided between the second current source and the current source terminal, and allows charge movement from the second current source to the current source terminal, while blocking charge movement from the current source terminal to the second current source.

4. The liquid ejecting apparatus according to claim 1, wherein the current source switch has a transistor.

5. The liquid ejecting apparatus according to 1, wherein the first current source has a power supply circuit, and
    the second current source has a capacitor.

6. The liquid ejecting apparatus according to claim 5, wherein the capacitor is charged with a charge to be moved while the element is discharged.

7. The liquid ejecting apparatus according to claim 6, further comprising:
    a discharging transistor that amplifies the current of the analog signal while the element is discharged, and pulls the current from the element, the discharging transistor having a pull terminal for pulling the current and an emission terminal for emitting the charge; and
    a charge emission destination connector that selects at least one charge emission destination from among a plurality of charge emission destinations including the capacitor according to the voltage of the analog signal, and connects the selected charge emission destination to the emission terminal.

8. The liquid ejecting apparatus according to claim 6, wherein the second current source emits the charge accumulated in the capacitor while the element is charged.

9. A liquid ejecting apparatus, comprising:
    an element that is charged and discharged so as to perform an operation to eject a liquid;
    an analog signal generating unit that generates an analog signal having a voltage change pattern for determining the operation of the element;
    a discharging transistor that amplifies the current of the analog signal while the element is discharged, and pulls the current from the element, the discharging transistor having a pull terminal for pulling the current and an emission terminal for emitting the charge; and
    a charge emission destination connector that selects at least one charge emission destination from among a plurality of charge emission destinations according to the voltage of the analog signal, and connects the selected charge emission destination to the emission terminal,
    wherein the charge emission destination connector selects at least one charge emission destination from among a plurality of charge emission destinations at different voltages,
    wherein the plurality of charge emission destinations have a first charge emission destination at a first voltage, and a second charge emission destination at a second voltage higher than the first voltage, and
    the charge emission destination connector includes:
    a charge emission destination switch that is provided between the emission terminal and the first charge emission destination, and
    a control circuit that outputs, to the charge emission destination switch, a control signal at a voltage level determined to control the operation of the charge emission destination switch on the basis of the voltage of the analog signal.

10. The liquid ejecting apparatus according to claim 8, wherein the charge emission destination connector switches a charge emission destination to be selected while the element is discharged.

11. The liquid ejecting apparatus according to claim 10, wherein the first charge emission destination is the ground, and the second charge emission destination is a capacitor.

12. The liquid ejecting apparatus according to claim 11, wherein the plurality of charge emission destinations have a first charge emission destination at a first voltage, and a second charge emission destination at a second voltage higher than the first voltage, and the charge emission destination connector includes a charge emission destination switch that is provided between the emission terminal and the first charge emission destination, and element that is provided between the emission terminal and the second charge emission destination, and allows charge movement from the emission terminal to the second charge emission destination, while blocking charge movement from the second charge emission destination to the emission terminal.

13. The liquid ejecting apparatus according to claim 9, wherein the charge emission destination switch is a transistor.

* * * * *